United States Patent
Pal et al.

(10) Patent No.: US 9,076,670 B2
(45) Date of Patent: Jul. 7, 2015

(54) INTEGRATED CIRCUIT AND METHOD OF FORMING THE INTEGRATED CIRCUIT WITH IMPROVED LOGIC TRANSISTOR PERFORMANCE AND SRAM TRANSISTOR YIELD

(71) Applicant: Texas Instruments Incorporated, Dallas, TX (US)

(72) Inventors: Himadri Sekhar Pal, Spring, TX (US); Ebenezer Eshun, Frisco, TX (US); Shashank S. Ekbote, San Diego, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/943,786

(22) Filed: Jul. 16, 2013

(65) Prior Publication Data

US 2015/0021706 A1    Jan. 22, 2015

(51) Int. Cl.
*H01L 21/8234* (2006.01)
*H01L 27/088* (2006.01)
*H01L 29/66* (2006.01)

(52) U.S. Cl.
CPC ........ *H01L 27/088* (2013.01); *H01L 29/66477* (2013.01)

(58) Field of Classification Search
CPC ................ H01L 27/11; H01L 27/0629; H01L 21/823807; H01L 21/823878; H01L 27/1207; H01L 27/1104
USPC .......... 257/301, 369, E21.646, E27.084, 296, 257/298; 438/310
See application file for complete search history.

(56) References Cited

U.S. PATENT DOCUMENTS

2012/0108020 A1* 5/2012 Baldwin et al. ............... 438/210
2014/0239407 A1* 8/2014 Manabe et al. ............... 257/369

* cited by examiner

*Primary Examiner* — Kenneth Parker
*Assistant Examiner* — Bo Fan
(74) *Attorney, Agent, or Firm* — Jacqueline J. Garner; Frank Cimino

(57) ABSTRACT

In an integrated circuit that includes an NMOS logic transistor, an NMOS SRAM transistor, and a resistor, the gate of the SRAM transistor is doped at the same time that the resistor is doped, thereby allowing the gate of the logic transistor to be separately doped without requiring any additional masking steps.

8 Claims, 5 Drawing Sheets

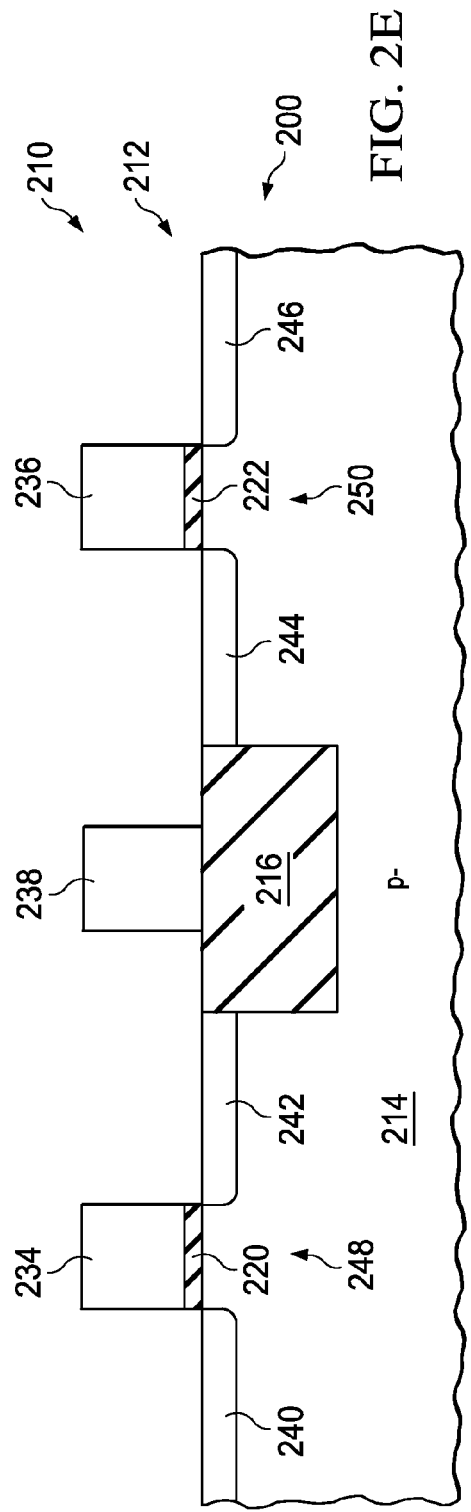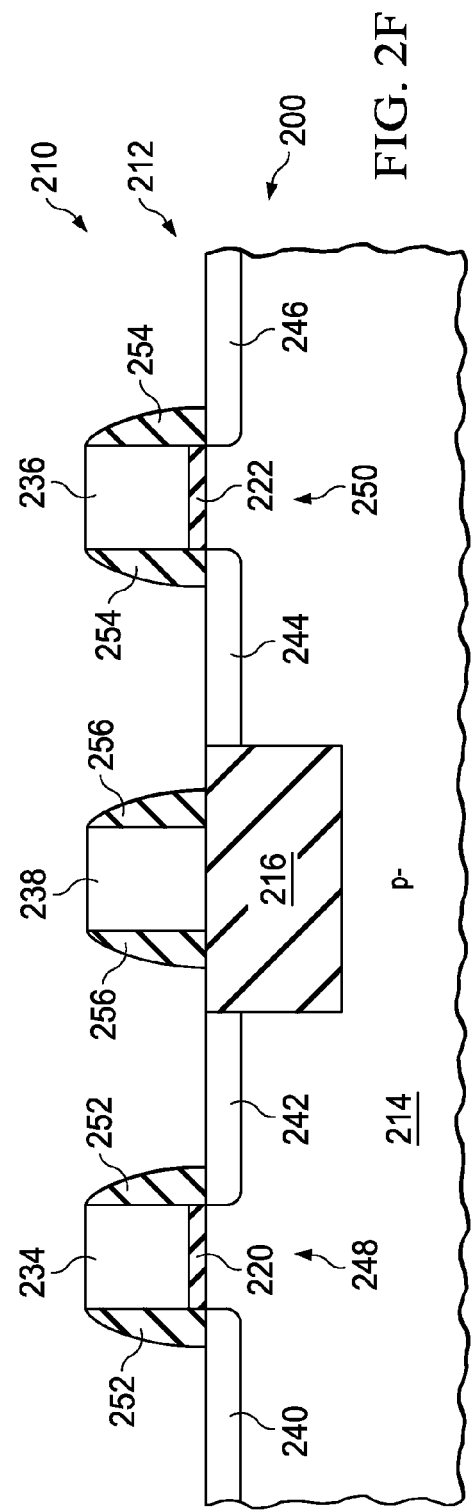

INTEGRATED CIRCUIT AND METHOD OF FORMING THE INTEGRATED CIRCUIT WITH IMPROVED LOGIC TRANSISTOR PERFORMANCE AND SRAM TRANSISTOR YIELD

BACKGROUND OF THE INVENTION

1. Field of the Invention

The present invention relates to integrated circuits and, more particularly, to an integrated circuit and a method of forming the integrated circuit with improved logic transistor performance and SRAM transistor yield.

2. Description of the Related Art

A system on a chip (SoC) is an integrated circuit that includes all of the elements required by an electronic device. A SoC often includes NMOS logic transistors, NMOS static random access memory (SRAM) transistors, and a number of resistors. The logic and SRAM transistors have gates which are commonly implemented with polycrystalline silicon (polysilicon). The resistors are also commonly implemented with polysilicon.

The fabrication of integrated circuits includes the formation and subsequent removal of a number of patterned photoresist layers. The formation and removal of patterned photoresist layers is a relatively expensive process. As a result, it is desirable to use the minimum possible number of patterned photoresist layers to reduce the fabrication costs.

One approach to minimize the number of patterned photoresist layers that must be used during the fabrication of a SoC is to form a patterned photoresist layer, and then simultaneously implant an n-type dopant into the regions of a polysilicon layer that will function as the logic gates and the SRAM gates.

A separate patterned photoresist layer is used to implant an n-type dopant into the regions of the polysilicon layer that will function as the resistors, which have a different dopant concentration than the logic and SRAM gates, to meet sheet resistance and temperature coefficient of resistance (TCR) targets.

One drawback to simultaneously implanting an n-type dopant into the regions of a polysilicon layer that will function as the logic gates and the SRAM gates is that the optimal dopant concentration for the logic gates is substantially different from the optimal dopant concentration for the SRAM gates.

The performance of the NMOS logic transistors improves with higher dopant concentrations, while higher dopant concentrations reduce the yield of the NMOS SRAM transistors. (Higher dopant concentrations in the logic gates reduce the effective gate dielectric thickness at inversion, which improves performance. However, higher dopant concentrations also lead to SRAM transistor cross diffusion where the n-type dopants from the n-type gate regions diffuse over into p-type gate regions. The diffusing n-type dopants reduce the effective p-type dopant concentrations in the p-type gate regions which, in turn, causes threshold voltage shifts and thereby a lower SRAM yield.) Conversely, the performance of the NMOS logic transistors degrades with lower dopant concentrations, while lower dopant concentrations improve the yield of the NMOS SRAM transistors.

Thus, the dose of the n-type dopant used to simultaneously implant the NMOS logic and SRAM transistor gates is commonly selected to be a comprise value that is less than the optimal dopant concentration for the logic gates and more than the optimal dopant concentration for the SRAM gates.

SUMMARY OF THE INVENTION

The present invention provides an integrated circuit with improved logic transistor performance and memory transistor yield. An integrated circuit of the present invention includes a substrate that has a first conductivity type, a logic region, and a memory region. The integrated circuit also includes a trench isolation structure that touches the substrate. The integrated circuit further includes a logic transistor that has a logic gate dielectric that touches and lies over the logic region of the substrate, and a logic gate that touches and lies over the logic gate dielectric. The logic gate has a dopant concentration. The integrated circuit additionally includes a memory transistor that has a memory gate dielectric that touches and lies over the memory region of the substrate, and a memory gate that touches and lies over the memory gate dielectric. The memory gate has a dopant concentration. The integrated circuit also includes a resistor that touches and lies over the trench isolation structure. The resistor has a dopant concentration that is substantially equal to the dopant concentration of the memory gate and substantially less than the dopant concentration of the logic gate.

The present invention also provides a method of forming an integrated circuit with improved logic transistor performance and memory transistor yield. The method of the present invention includes implanting an n-type dopant into a logic transistor region of a polycrystalline silicon (polysilicon) layer. The logic transistor region has a dopant concentration. The method also includes simultaneously implanting an n-type dopant into a memory transistor region and a resistor region of the polysilicon layer. The memory transistor region has a dopant concentration. The resistor region has a dopant concentration that is substantially equal to the dopant concentration of the memory transistor region and substantially less than the dopant concentration of the logic transistor region.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 2A-2H are cross-sectional views illustrating an example of a method 200 of forming an integrated circuit in accordance with the present invention.

DETAILED DESCRIPTION OF THE INVENTION

Figure 1:
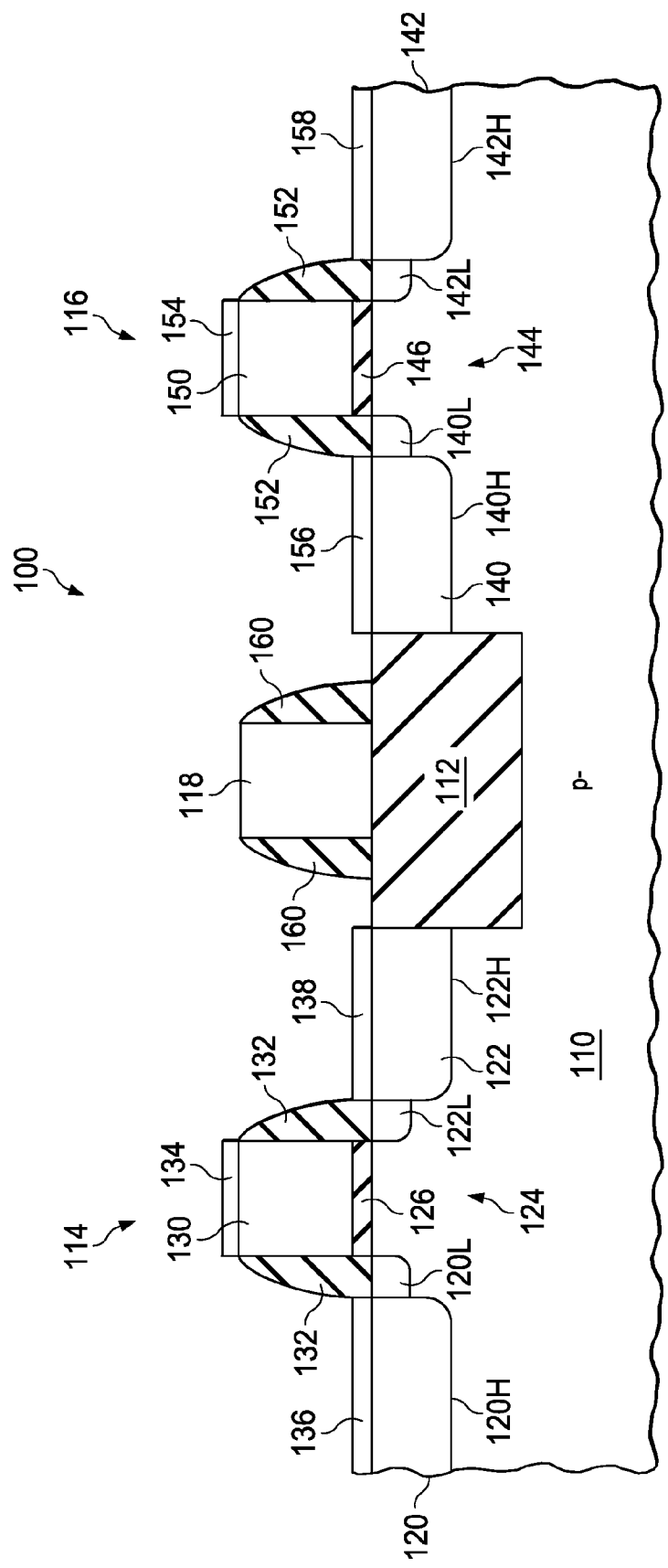
FIG. 1 is a cross-sectional view illustrating an example of an integrated circuit 100 in accordance with the present invention.

FIG. 1 shows a cross-sectional view that illustrates an example of an integrated circuit 100 in accordance with the present invention. As described in greater detail below, in an integrated circuit that includes logic transistors, SRAM transistors, and resistors, the present invention improves the performance of the logic transistors while at the same time improving the yield of the SRAM transistors.

As shown in FIG. 1, semiconductor structure 100 includes a p-type single-crystal-silicon substrate region 110, and a trench isolation structure 112 that touches substrate region 110. In addition, semiconductor structure 100 includes an NMOS logic transistor 114, an NMOS SRAM transistor 116, and a polycrystalline silicon (polysilicon) resistor 118.

NMOS logic transistor 114 includes an n-type source 120 and an n-type drain 122 that each touch p-type substrate region 110. Source 120 includes a lighter-doped region 120L, and a heavier-doped region 120H. Similarly, drain 122 includes a lighter-doped region 122L, and a heavier-doped region 122H. Further, substrate region 110 has a channel region 124 that lies between source 120 and drain 122.

NMOS logic transistor 114 also includes a gate dielectric 126 that touches and lies over channel region 124, and a polysilicon gate 130 that touches gate dielectric 126 and lies over channel region 124. NMOS logic transistor 114 additionally includes a sidewall spacer 132 that touches and laterally surrounds gate dielectric 126 and polysilicon gate 130. NMOS logic transistor 114 further includes a gate silicide structure 134 that touches and lies over gate 130, a source silicide structure 136 that touches and lies over source 120, and a drain silicide structure 138 that touches and lies over drain 122.

As further shown in FIG. 1, NMOS SRAM transistor 116 includes an n-type source 140 and an n-type drain 142 that each touch p-type substrate region 110. Source 140 includes a lighter-doped region 140L, and a heavier-doped region 140H. Similarly, drain 142 includes a lighter-doped region 142L, and a heavier-doped region 142H. Further, substrate region 110 has a channel region 144 that lies between source 140 and drain 142.

NMOS SRAM transistor 116 also includes a gate dielectric 146 that touches and lies over channel region 144, and a polysilicon gate 150 that touches gate dielectric 146 and lies over channel region 144. NMOS SRAM transistor 116 additionally includes a sidewall spacer 152 that touches and laterally surrounds gate dielectric 146 and polysilicon gate 150.

NMOS logic transistor 116 further includes a gate silicide structure 154 that touches and lies over gate 150, a source silicide structure 156 that touches and lies over source 140, and a drain silicide structure 158 that touches and lies over drain 142. In addition, a sidewall spacer 160 touches and laterally surrounds resistor 118.

In accordance with the present invention, polysilicon resistor 118 and polysilicon gate 150 of NMOS SRAM transistor 116 have substantially equal n-type dopant concentrations. In addition, polysilicon gate 130 of NMOS logic transistor 114 has an n-type dopant concentration that is substantially greater than the n-type dopant concentrations of polysilicon resistor 118 and polysilicon gate 150.

NMOS logic transistor 114, NMOS SRAM transistor 116, and resistor 118 operate in a conventional fashion, except that raising the n-type dopant concentration of polysilicon gate 130 of NMOS logic transistor 114 while at the same time lowering the n-type dopant concentration of polysilicon gate 150 of NMOS SRAM transistor 116 improves the performance of the NMOS logic transistors and the yield of the NMOS SRAM transistors.

Figure 2A:
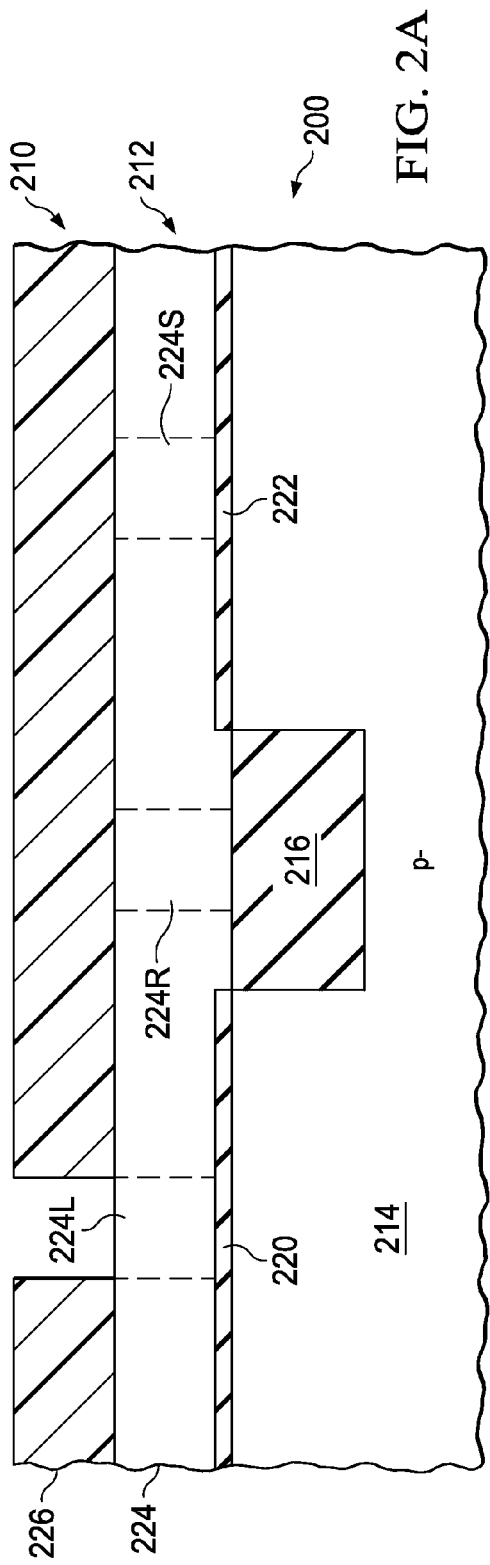

FIGS. 2A-2H show cross-sectional views that illustrate an example of a method 200 of forming an integrated circuit in accordance with the present invention. As shown in FIG. 2A, method 200 utilizes a partially-completed conventionally-formed transistor structure 210 that includes a semiconductor body 212. Semiconductor body 212, in turn, includes a p-type single-crystal-silicon substrate region 214 and a trench isolation structure 216 that touches substrate region 214.

In addition, transistor structure 210 includes a logic gate dielectric 220 that touches the top surface of substrate region 214, a SRAM gate dielectric 222 that touches the top surface of substrate region 214, and a polysilicon layer 224 that touches and lies over trench isolation structure 216, logic gate dielectric 220, and SRAM gate dielectric 222. Polysilicon layer 224 includes a logic gate region 224L, a SRAM gate region 224S, and a resistor region 224R, which are spaced apart from each other.

As further shown in FIG. 2A, method 200 begins by forming a patterned photoresist layer 226 on polysilicon layer 224. Patterned photoresist layer 226 is formed in conventional manner, which includes depositing a layer of photoresist, projecting a light through a patterned black/clear glass plate known as a mask to form a patterned image on the layer of photoresist to soften the photoresist regions exposed by the light, and removing the softened photoresist regions.

After patterned photoresist layer 226 has been formed, logic gate region 224L of polysilicon layer 224 is implanted with an n-type dopant. Following the implantation, patterned photoresist layer 226 is removed in a conventional manner. For example, patterned photoresist layer 226 can be removed with a conventional ash process.

Figure 2B:
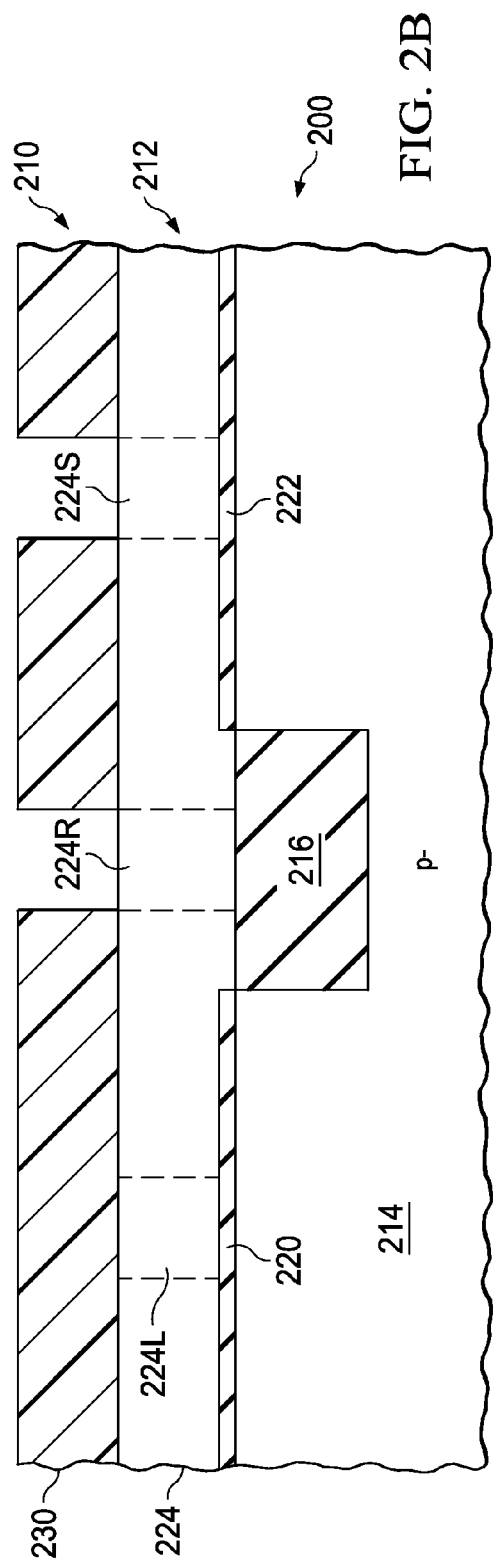

As shown in FIG. 2B, after patterned photoresist layer 226 has been removed, a patterned photoresist layer 230 is formed on polysilicon layer 224 in conventional manner. After patterned photoresist layer 230 has been formed, the SRAM gate region 224S and resistor region 224R of polysilicon layer 224 are simultaneously implanted with an n-type dopant.

As a result, the SRAM gate region 224S and resistor region 224R of polysilicon layer 224 have substantially the same dopant concentration. In the present example, the dopant concentration required by resistor region 224R (to meet sheet resistance and temperature coefficient of resistance (TCR) targets for a to-be-formed resistor) defines the dopant concentration for SRAM gate region 224S.

In addition, the dopant concentrations of the SRAM gate region 224S and resistor region 224R of polysilicon layer 224 are substantially less than the dopant concentration of logic gate region 224L. Following the implantation, patterned photoresist layer 230 is removed in a conventional manner.

Figure 2C:
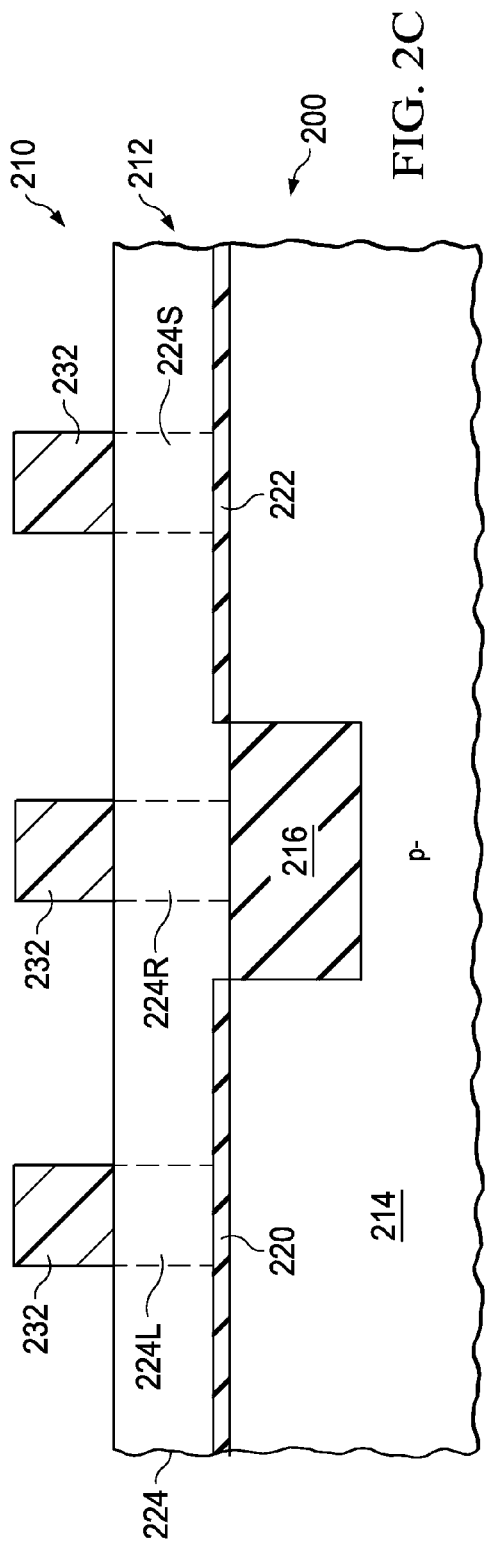
Figure 2D:
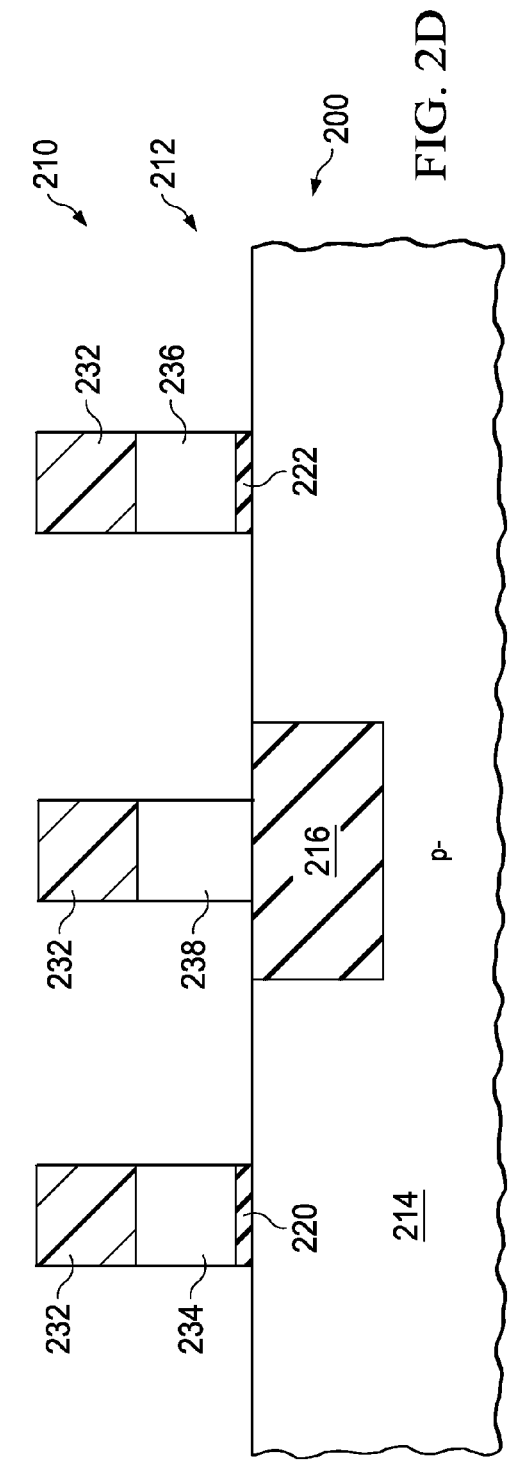

As shown in FIG. 2C, after patterned photoresist layer 230 has been removed, a patterned photoresist layer 232 is formed on polysilicon layer 224 in conventional manner. As shown in FIG. 2D, after patterned photoresist layer 232 has been formed, the exposed regions of polysilicon layer 224 and the underlying regions of the gate dielectrics 220 and 222 are etched in a conventional fashion to form a logic gate 234 from the logic gate region 224L, a SRAM gate 236 from the SRAM gate region 224S, and a resistor 238 from the resistor region 224R. Following the etch, patterned photoresist layer 232 is removed in a conventional manner.

As shown in FIG. 2E, once patterned photoresist layer 232 has been removed, an n-type dopant is implanted into the top surface of p-type substrate region 214 to form n-type lighter-doped logic source and drain regions 240 and 242 in substrate region 214, and n-type lighter-doped SRAM source and drain regions 244 and 246 in substrate region 214. In addition, the implant increases the dopant concentrations of logic gate 234, SRAM gate 236, and resistor 238 by an equal amount. Further, the implant defines a channel region 248 of substrate region 214 that lies between source and drain regions 240 and 242, and a channel region 250 of substrate region 214 that lies between source and drain regions 244 and 246.

After the lighter-doped source and drain regions 240/244 and 242/246 have been formed, a non-conductive layer is formed on logic gate 234, SRAM gate 236, and resistor 238 in a conventional manner. Non-conductive layer 248 can be implemented with, for example, a layer of oxide.

As shown in FIG. 2F, after the non-conductive layer has been formed, the non-conductive layer is anisotropically etched until the top surfaces of logic gate 234, SRAM gate 236, and resistor 238 have been exposed. The anisotropic etch forms a sidewall spacer 252 that touches and laterally surrounds logic gate 234, a sidewall spacer 254 that touches and laterally surrounds SRAM gate 236, and a sidewall spacer 256 that touches and laterally surrounds resistor 238.

Figure 2G:
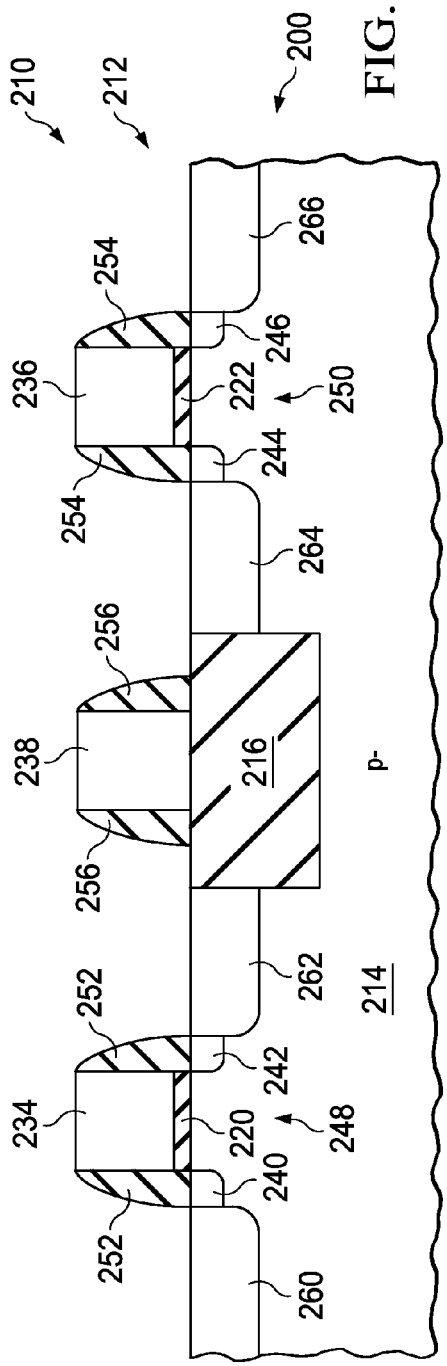

As shown in FIG. 2G, after the sidewall spacers 252, 254, and 256 have been formed, an n-type dopant is implanted into the top surface of p-type substrate region 214 to form n-type heavier-doped logic source and drain regions 260 and 262 in substrate region 214, and n-type heavier-doped SRAM source and drain regions 264 and 266 in substrate region 214. In addition, the implant increases the dopant concentrations of logic gate 234, SRAM gate 236, and resistor 238 by an equal amount.

Figure 2H:
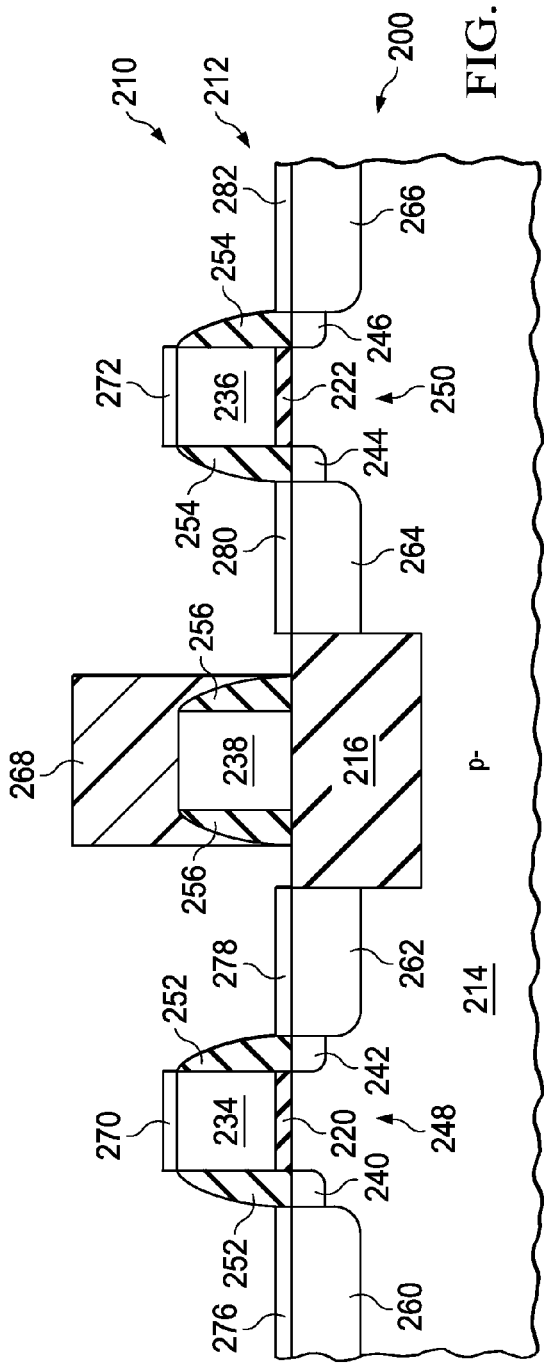

As shown in FIG. 2H, after the heavier-doped regions 260/264 and 262/266 have been formed, a patterned photoresist layer 268 is conventionally formed to touch and cover resistor 238 and sidewall spacer 256. Following this, the top surfaces of logic gate 234, SRAM gate 236, and the source and drain regions 260/264 and 262/266 are silicided in a conventional manner to form a silicide structure 270 on logic gate 234, a silicide structure 272 on SRAM gate 236, a silicide structure 276 on source region 260, a silicide structure 278 on drain region 262, a silicide structure 280 on source region 264, and a silicide structure 282 on drain region 266. Patterned photoresist layer 268 protects the top surface of resistor 238 from silicidation. Following this, patterned photoresist layer 268 is removed in a conventional fashion, and method 200 continues with conventional steps.

Thus, in an integrated circuit that includes an NMOS logic transistor, an NMOS SRAM transistor, and a resistor, the present invention dopes the gate of the SRAM transistor at the same time that the resistor is doped which, in turn, allows the gate of the logic transistor to be separately doped. As a result, the performance of the logic transistors and the yield of the SRAM transistors are improved without requiring any additional masking steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. An integrated circuit comprising:
    a substrate region having a first conductivity type, a logic region, and a memory region;
    a trench isolation structure that touches the substrate region;
    a logic transistor having:
        a logic gate dielectric that touches and lies over the logic region of the substrate region; and
        a logic gate that touches and lies over the logic gate dielectric, the logic gate having a dopant concentration;
    a memory transistor having:
        a memory gate dielectric that touches and lies over the memory region of the substrate region; and
        a memory gate that touches and lies over the memory gate dielectric, the memory gate having a dopant concentration; and
    a resistor that touches and lies over the trench isolation structure, the resistor having a dopant concentration that is substantially equal to the dopant concentration of the memory gate and substantially less than the dopant concentration of the logic gate.

2. The integrated circuit of claim 1 and further comprising:
    a silicide structure that touches the logic gate; and
    a silicide structure that touches the memory gate.

3. The integrated circuit of claim 1 wherein the logic transistor further includes:
    a logic source and drain of a second conductivity type that touch the substrate region; and
    a logic channel region of the substrate region that lies between the logic source and drain.

4. The integrated circuit of claim 3 wherein the logic gate dielectric touches and lies over the logic channel region.

5. The integrated circuit of claim 3 wherein the memory transistor further includes:
    a memory source and drain of the second conductivity type that touch the substrate region; and
    a memory channel region of the substrate region that lies between the memory source and drain.

6. The integrated circuit of claim 5 wherein the memory gate dielectric touches and lies over the memory channel region.

7. The integrated circuit of claim 5 and further comprising:
    a sidewall spacer that touches and laterally surrounds the logic gate;
    a sidewall spacer that touches and laterally surrounds the SRAM gate; and
    a sidewall spacer that touches and laterally surrounds the resistor.

8. The integrated circuit of claim 7 wherein the logic source includes a lighter doped region and a heavier doped region that touches the lighter doped region.

* * * * *